(12) United States Patent
Kim et al.

(10) Patent No.: US 7,718,504 B2
(45) Date of Patent: May 18, 2010

(54) SEMICONDUCTOR DEVICE HAVING ALIGN KEY AND METHOD OF FABRICATING THE SAME

(75) Inventors: Sang-Su Kim, Gyeonggi-do (KR); In-Wook Cho, Gyeonggi-do (KR); Myeong-Cheol Kim, Gyeonggi-do (KR); Sung-Woo Lee, Gyeonggi-do (KR); Jin-Hee Kim, Gyeonggi-do (KR); Doo-Youl Lee, Seoul (KR); Sung-Ho Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 834 days.

(21) Appl. No.: 11/535,934

(22) Filed: Sep. 27, 2006

(65) Prior Publication Data

US 2007/0099378 A1 May 3, 2007

Related U.S. Application Data

(62) Division of application No. 10/982,685, filed on Nov. 4, 2004, now Pat. No. 7,129,591.

(30) Foreign Application Priority Data

Nov. 18, 2003 (KR) ................................ 2003-81873

(51) Int. Cl.
*H01L 21/76* (2006.01)
*H01L 21/46* (2006.01)

(52) U.S. Cl. ........................ 438/401; 438/462; 438/975

(58) Field of Classification Search .................. 438/401, 438/462, 975; 257/797, E23.179
See application file for complete search history.

(56) References Cited

U.S. PATENT DOCUMENTS

| 4,783,766 A | 11/1988 | Samachisa et al. |
| 5,914,510 A | 6/1999 | Hieda |
| 6,753,617 B2 * | 6/2004 | Stanton et al. ............... 257/797 |
| 6,756,691 B2 * | 6/2004 | Tomita et al. ................ 257/797 |

(Continued)

FOREIGN PATENT DOCUMENTS

JP 02-306666 12/1990

(Continued)

OTHER PUBLICATIONS

English language abstract of Japanese Publication No. 11-067894.

(Continued)

*Primary Examiner*—Hung Vu
(74) *Attorney, Agent, or Firm*—Volentine & Whitt, PLLC (57) ABSTRACT

Disclosed is a semiconductor device having an align key and a method of fabricating the same. The semiconductor device includes a semiconductor substrate having a cell area and an align key area. An isolation layer that defines a cell active area is disposed in the cell area of the semiconductor substrate. A cell charge storage layer pattern is disposed across the cell active area. An align charge storage layer pattern is disposed in the align key area of the semiconductor substrate. An align trench self-aligned with the align charge storage layer pattern is formed in the align key area of the semiconductor substrate.

9 Claims, 8 Drawing Sheets

U.S. PATENT DOCUMENTS 6,764,954 B2 * 7/2004 Diewald et al. ............. 438/692

FOREIGN PATENT DOCUMENTS

| JP | 08-106791 | 4/1996 |
|---|---|---|
| JP | 63-237433 | 10/1998 |
| JP | 11-067894 | 3/1999 |
| JP | 11-354400 | 12/1999 |
| JP | 2001-036036 | 2/2001 |
| JP | 2001-102440 | 4/2001 |
| JP | 2002-134701 | 5/2002 |
| KR | 2002-0056269 | 7/2002 |
| KR | 2002-0077936 | 10/2002 |

OTHER PUBLICATIONS

English language abstract of Japanese Publication No. 11-354400.
English language abstract of Japanese Publication No. 2002-134701.
English language abstract of Korean Publication No. 2002-0056269.

* cited by examiner

SEMICONDUCTOR DEVICE HAVING ALIGN KEY AND METHOD OF FABRICATING THE SAME

CROSS-REFERENCE TO RELATED APPLICATION

This application is a Divisional of U.S. patent application Ser. No. 10/982,685, filed on Nov. 4, 2004, now pending, which claims the benefit of Korean Patent Application No. 2003-81873, filed on Nov. 18, 2003, the disclosure of which is hereby incorporated herein by reference in its entirety.

BACKGROUND OF THE INVENTION

1. Field of the Invention

This disclosure relates to a semiconductor device and a method of fabricating the same and, more particularly, to a semiconductor device having an align key and a method of fabricating the same.

2. Description of the Related Art

A photolithography process plays an important role in manufacturing a highly-integrated semiconductor device having a stacked structure. The semiconductor device is completed through a set of photolithography processes, each of which requires a photomask to be exactly aligned on a semiconductor substrate in order to minimize misalignment between layers. To this end, in conventional photolithography and etching processes, processes of aligning the photomask and the semiconductor substrate, measuring alignment accuracy, and correcting an alignment error are performed. In order to perform such processing steps, an align key and an overlay key are disposed in predetermined areas of the semiconductor substrate.

The align key is used for aligning the photomask with a wafer before exposure during the photolithography process. The overlay key is used to measure whether a pattern on the photomask is exactly overlapped on the semiconductor substrate after exposure and development. Generally, the align key and the overlay key are formed in a structure having a step against surface within a scribe lane between main chips. For example, the align key and the overlay key are formed in a trench type structure or in a protrusion structure bulged from the semiconductor substrate. In the photolithography process, a method of making alignment and correcting thereof with the align key and the overlay key is as follows. When a light source in an alignment unit of a stepper is illuminated on the align key or the overlay key formed in the semiconductor substrate, an interference pattern is formed due to the step formed in the align key or the overlay key. By detecting light and shade of the interference pattern in a detection unit to identify a direction or a position of the semiconductor substrate, and by adjusting the semiconductor substrate or the photomask, the alignment and the correction thereof are performed.

A conventional method of forming the trench type align key is taught in Japanese Patent Publication No. 2002-134701, entitled "method of fabricating semiconductor device."

According to the Japanese Patent Publication No. 2002-134701, a buried dielectric layer is simultaneously formed in an align key area during formation of an isolation layer in a cell area of the semiconductor substrate. Photolithography and anisotropic etching processes are then performed to selectively etch the buried dielectric layer in the align key area. As a result, an align key having a step with a predetermined depth is formed in the align key area.

Conventional flash memory devices are typically categorized as either floating gate type memory devices or floating trap type memory devices according to gate structures of unit cells. Also, the unit cells of the flash memory devices may be classified into stack gate cells or split gate cells according to the structures of the unit cells.

The conventional flash memory device having the split gate structure is taught in U.S. Pat. No. 4,783,766.

Figure 1:
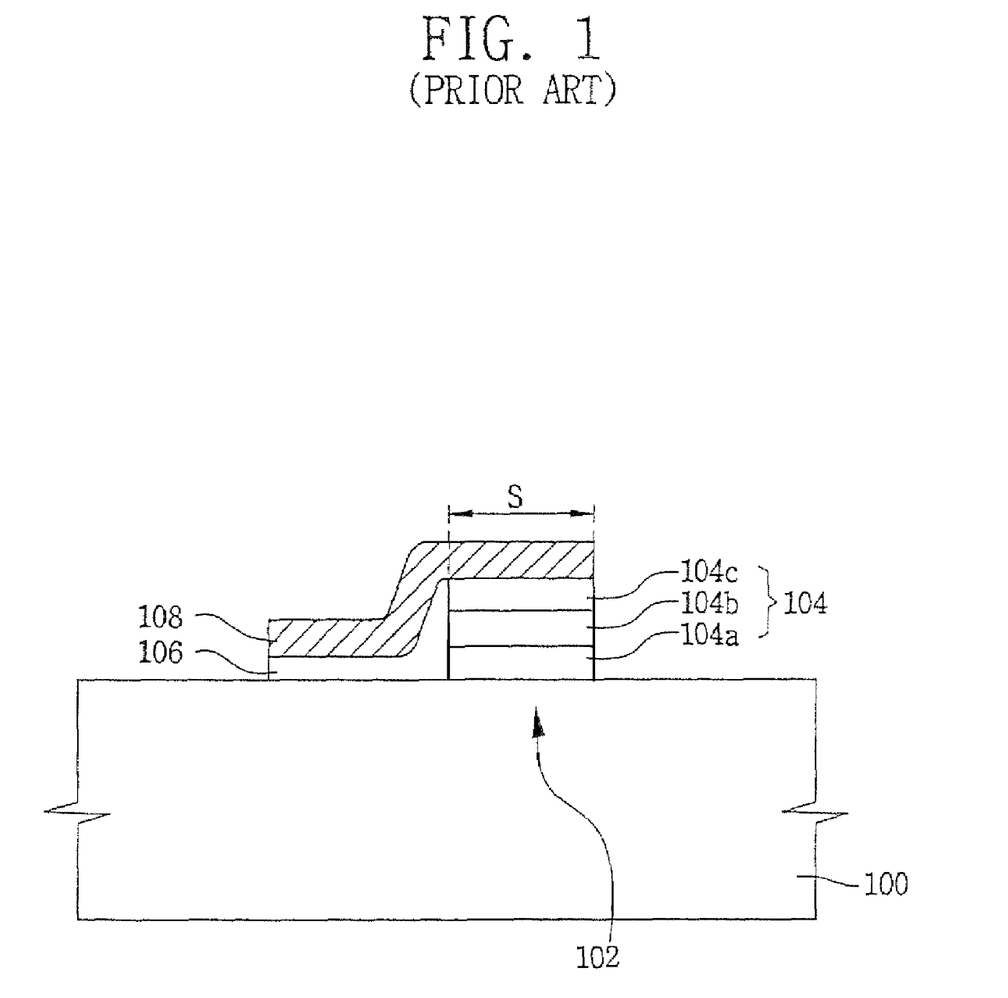
FIG. 1 is a cross-sectional view illustrating the conventional flash memory device having a split gate structure.

FIG. 1 is a cross-sectional view illustrating the conventional flash memory device having the split gate structure disclosed in the U.S. Pat. No. 4,783,766.

Referring to FIG. 1, an isolation layer (not shown) defining an active area 102 is disposed within a semiconductor substrate 100. A charge storage layer pattern 104 is disposed across the active area 102. The charge storage layer pattern 104 includes a tunnel dielectric layer 104a, a floating gate 104b and an inter-gate dielectric layer 104c, which are sequentially stacked. A gate dielectric layer 106 is disposed on the semiconductor substrate 100 adjacent the charge storage layer pattern 104. A control gate 108 is disposed, above the charge storage layer pattern 104 and the gate oxide layer 106.

The control gate 108 should be directly aligned with the charge storage layer pattern 104 in order to minimize alignment tolerance. However, a photolithography process for forming the control gate 108 utilizes an align key which is simultaneously formed with the isolation layer. In other words, the control gate 108 is indirectly aligned with the charge storage layer pattern 104. This may lead to misalignment between the control gate 108 and the charge storage layer pattern 104, and alignment variations may not be uniform throughout the semiconductor substrate. That is, overlap areas S between the control gates 108 and the charge storage layer patterns 104 may not be uniform throughout the semiconductor substrate. The nonuniform overlap areas S may cause nonuniform threshold voltage of programmed cells or erased cells.

SUMMARY OF THE INVENTION

In one embodiment, a semiconductor device comprises a semiconductor substrate having a cell area and an align key area thereon, an isolation layer disposed in the cell area to define a cell active area therein, a cell charge storage layer pattern extending across the cell active area, an align charge storage layer pattern disposed in the align key area, and an align trench formed in the align key area and self-aligned with the align charge storage layer pattern.

In another embodiment, a semiconductor substrate having a cell area and an align key area thereon is prepared. An isolation layer to define a cell active area is formed within the semiconductor substrate. A charge storage layer pattern is formed to extend across the cell active area. An align charge storage layer pattern is formed on the align key area. An align trench is formed self-aligned with the align charge storage layer pattern within the align key area.

BRIEF DESCRIPTION OF THE DRAWINGS

The above and other features and advantages of the invention will become more apparent to those of ordinary skill in the art by describing in detail preferred embodiments thereof with reference to the attached drawings.

DETAILED DESCRIPTION OF THE PREFERRED EMBODIMENTS

Embodiments of the invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

Figure 2:
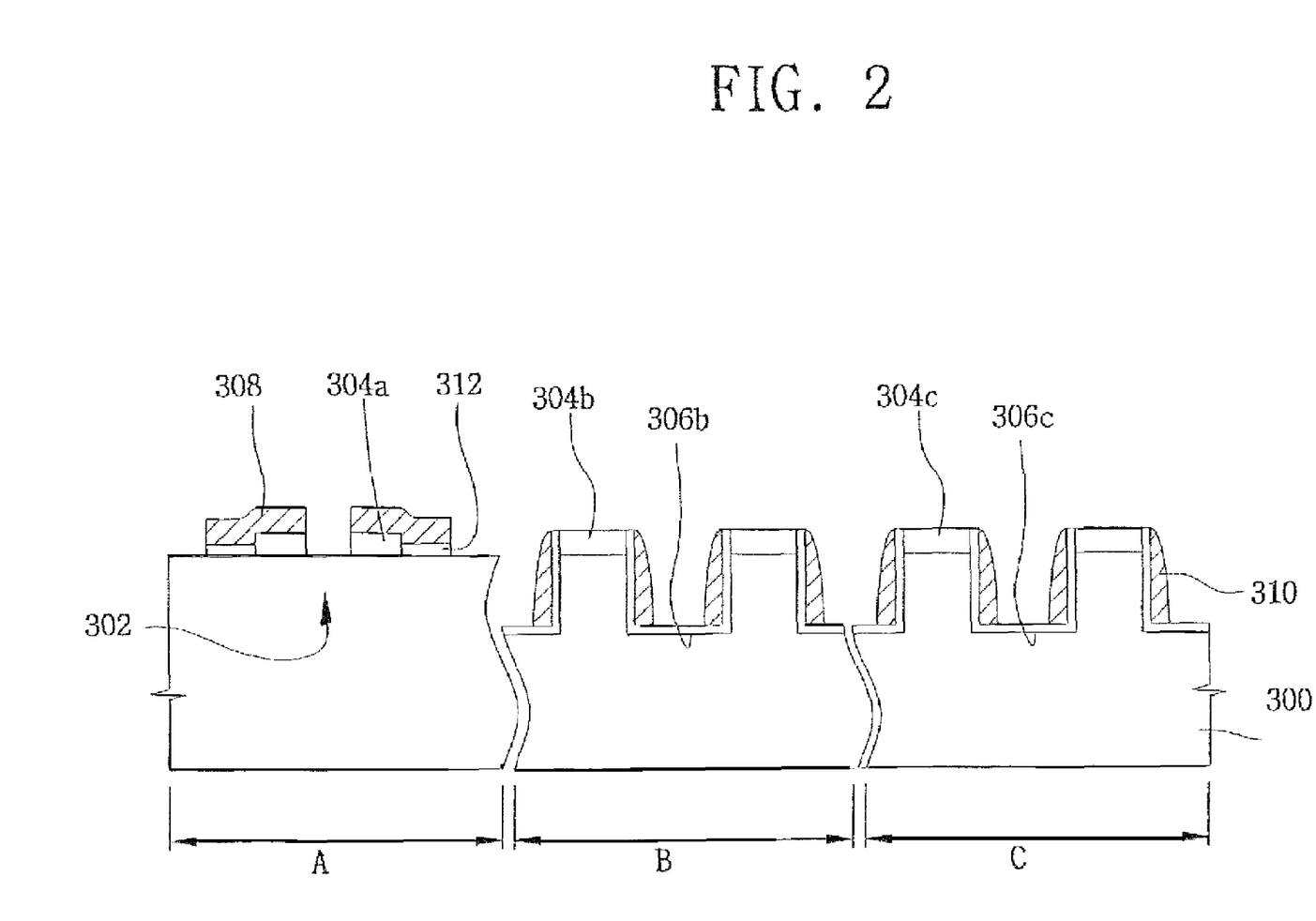
FIG. 2 is a cross-sectional view illustrating a semiconductor device according to an embodiment of the invention.

FIG. 2 is a cross-sectional view illustrating a semiconductor device according to an embodiment of the invention. In FIG. 2, reference characters "A" and "B" indicate a cell area and a charge storage layer align key area respectively. Further, a reference character "C" indicates a charge storage layer overlay key area.

An isolation layer (not shown) that defines a cell active area 302 is disposed within semiconductor substrate 300 having the cell area A, the charge storage layer align key area B and the charge storage layer overlay key area C. The charge storage layer align key area B and the charge storage layer overlay key area C are located on a scribe lane defining a main chip area of the semiconductor substrate 300. Cell charge storage layer patterns 304a are disposed over the cell active area 302. Further, align charge storage layer patterns 304b and overlay charge storage layer patterns 304c are disposed in the charge storage layer align key area B and the charge storage layer overlay key area C of the semiconductor substrate, respectively.

Each of the cell charge storage layer patterns 304a, the align charge storage layer patterns 304b and the overlay charge storage layer patterns 304c may include a tunnel dielectric layer, an insulating charge trapping layer and a blocking dielectric layer, which are sequentially stacked. The tunnel dielectric layer and the blocking layer may be, for example, a silicon oxide layer ($SiO_2$). The insulating charge trapping layer may be a silicon nitride layer (SiN). In other words, each of the cell charge storage layer patterns 304a, the align charge storage layer patterns 304b, and the overlay charge storage layer patterns 304c may be a silicon oxide/silicon nitride/silicon oxide (ONO) layer. According to an embodiment of the invention, if the charge storage layer patterns 304a, 304b, and 304c include the charge trapping layer, the semiconductor device is a floating trap type flash memory device.

Each of the cell charge storage layer patterns 304a, the align charge storage layer patterns 304b and the overlay charge storage layer patterns 304c may include a tunnel dielectric layer, a conductive floating gate and a inter-gate dielectric layer, which are sequentially stacked. The tunnel dielectric layer and the inter-gate dielectric layer may be a silicon oxide layer. Further, the conductive floating gate may be a polysilicon layer. According to an aspect of the invention, if the charge storage layer patterns 304a, 304b, and 304c include the conductive floating gate, the semiconductor device is a floating gate type flash memory device.

Further, each of the cell charge storage layer patterns 304a, the align charge storage layer patterns 304b and the overlay charge storage layer patterns 304c may be a silicon oxide layer, a high-k dielectric layer or a stack layer with a combination thereof. The high-k dielectric layer may be SiN, SiON, $HfO_2$ or $Al_2O_3$.

A recessed charge storage layer align trench 306b and a recessed charge storage layer overlay trench 306c are respectively disposed in the charge storage layer align key area B and the charge storage layer overlay key area C of the semiconductor substrate. The charge storage layer align trench 306b and the charge storage layer overlay trench 306c are respectively self-aligned with the align charge storage layer patterns 304b and the overlay charge storage layer patterns 304c. Gate electrodes 308 are disposed to cross over the cell active area 302 adjacent the cell charge layer pattern 304a. The gate electrodes 308 may be extended to cover the cell charge storage patterns 304a. In more detail, the gate electrodes 308 may cover only sidewalls of the cell charge storage layer patterns 304a or may be extended to cover top surface of the cell charge storage layer patterns 304a as well as the sidewalls thereof. The gate electrodes 308 may be a polysilicon layer, a polysilicon germanium layer or a metal layer. The metal layer may be, for example, tungsten W, titanium Ti, or titanium nitride TiN. Further, the gate electrode 308 may be a stack layer with a combination of at least two layers chosen from the polysilicon layer, the polysilicon germanium layer or the metal layer. The gate electrode 308 corresponds to a control gate electrode of the flash memory device. Meanwhile, a spacer-shaped conductive layer pattern 310 may be disposed on the sidewalls of the charge storage layer align trench 306b and the charge storage layer overlay trench 306c.

A gate dielectric layer 312 is interposed between the gate electrode 308 adjacent the cell charge storage layer pattern 304a and the cell active area 302. The gate dielectric layer 312 may be a silicon oxide layer or a silicon oxi-nitride layer.

Figure 3:
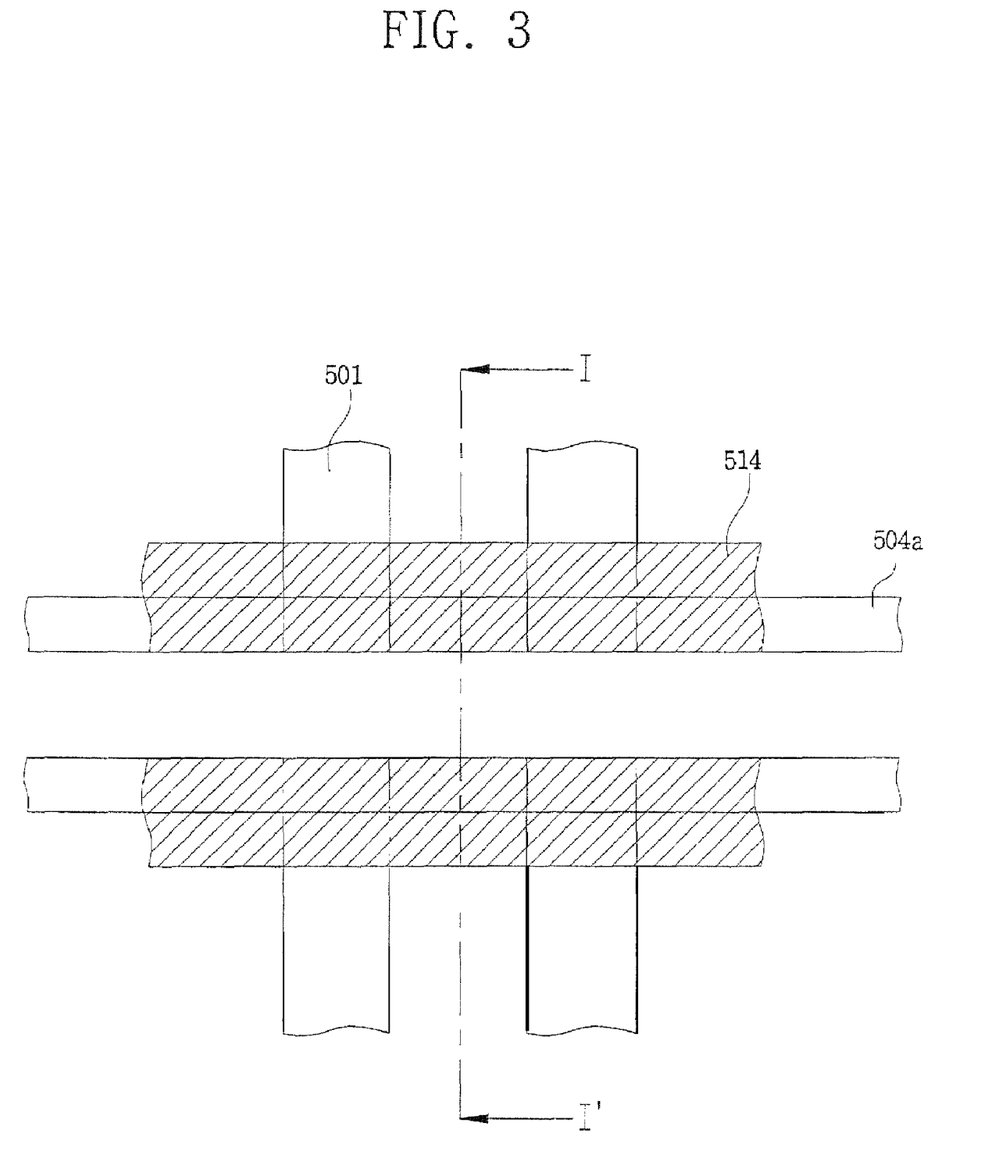
FIG. 3 is a plan view showing a portion of a cell area of a semiconductor device according to an embodiment of the invention.

FIG. 3 is a plan view showing a portion of a cell area of a semiconductor device according to an embodiment of the invention.

FIGS. 4 to 9 are cross-sectional views illustrating methods for fabricating a semiconductor device according to embodiments of the invention. In FIGS. 4 to 9, reference characters "A'" and "B'" refer to a cell area and a charge storage layer align key area respectively. Further, a reference character "C'" refers to a charge storage layer overlay key area. Additionally, the cell areas A' of FIGS. 4 to 9 are cross-sectional views taken along line I-I' of FIG. 3.

Figure 4:
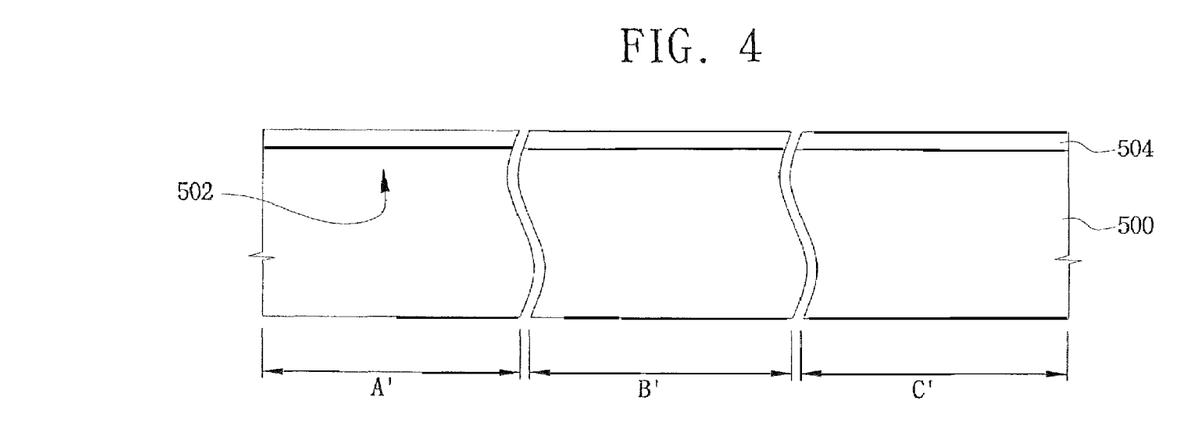
FIGS. 4 to 9 are cross-sectional views illustrating a method for manufacturing a semiconductor device according to an embodiment of the invention.

Referring to FIGS. 3 and 4, an isolation layer 501 that defines an active area 502 is formed in a semiconductor substrate 500 having a cell area A', a charge storage layer align key area B' and a charge storage layer overlay key area C'. The charge storage layer align key area B' and the charge storage layer overlay key area C' are located on a scribe lane that defines main chip areas on the semiconductor substrate 500. The isolation layer 501 may be formed using a conventional shallow trench isolation (STI) process. Subsequently, a charge storage layer 504 is formed on the semiconductor substrate 500 having the isolation layer 501. The charge storage layer 504 may be formed using a CVD process, but the formation is not limited to that process. According to an embodiment of the invention, the charge storage layer 504 may be formed of an ONO layer or a stack layer of a silicon oxide layer, a polysilicon layer and a silicon oxide layer, which are sequentially stacked. Further, the charge storage layer 504 may be formed of a silicon oxide layer or a high-k dielectric layer or a stack layer with a combination thereof.

Figure 5:
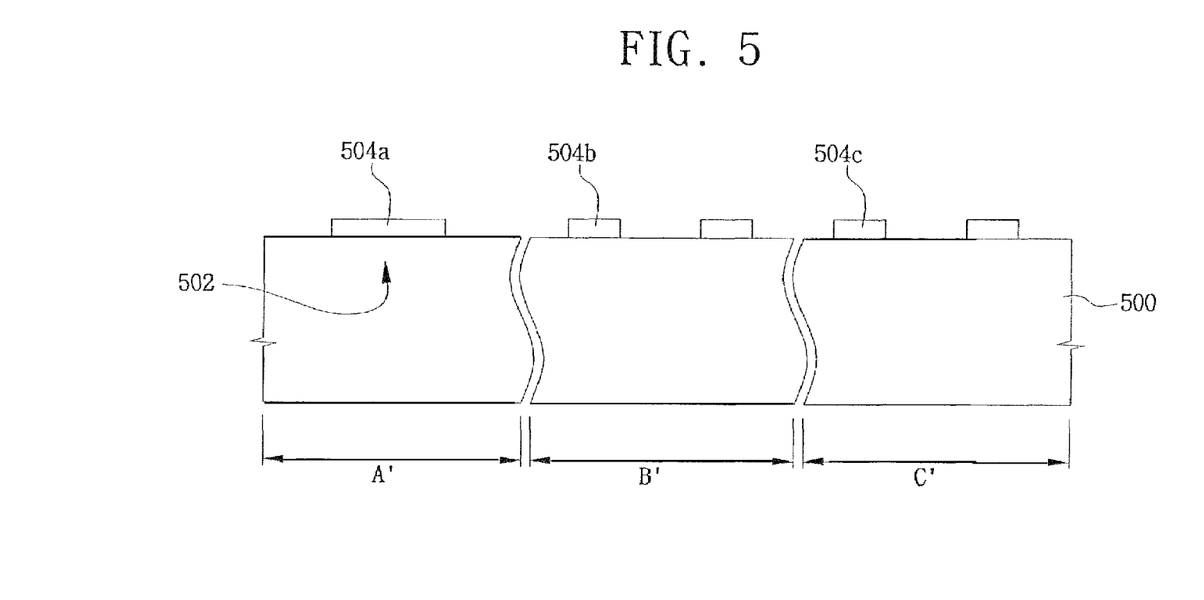

Referring to FIGS. 3 and 5, the charge storage layer 504 is patterned to form a cell charge storage layer pattern 504a on the cell active area 502. At the same time, an align charge storage layer pattern 504b and an overlay charge storage layer pattern 504c are formed on the charge storage layer align key area B' and the charge storage layer overlay key area C', respectively.

Figure 6:
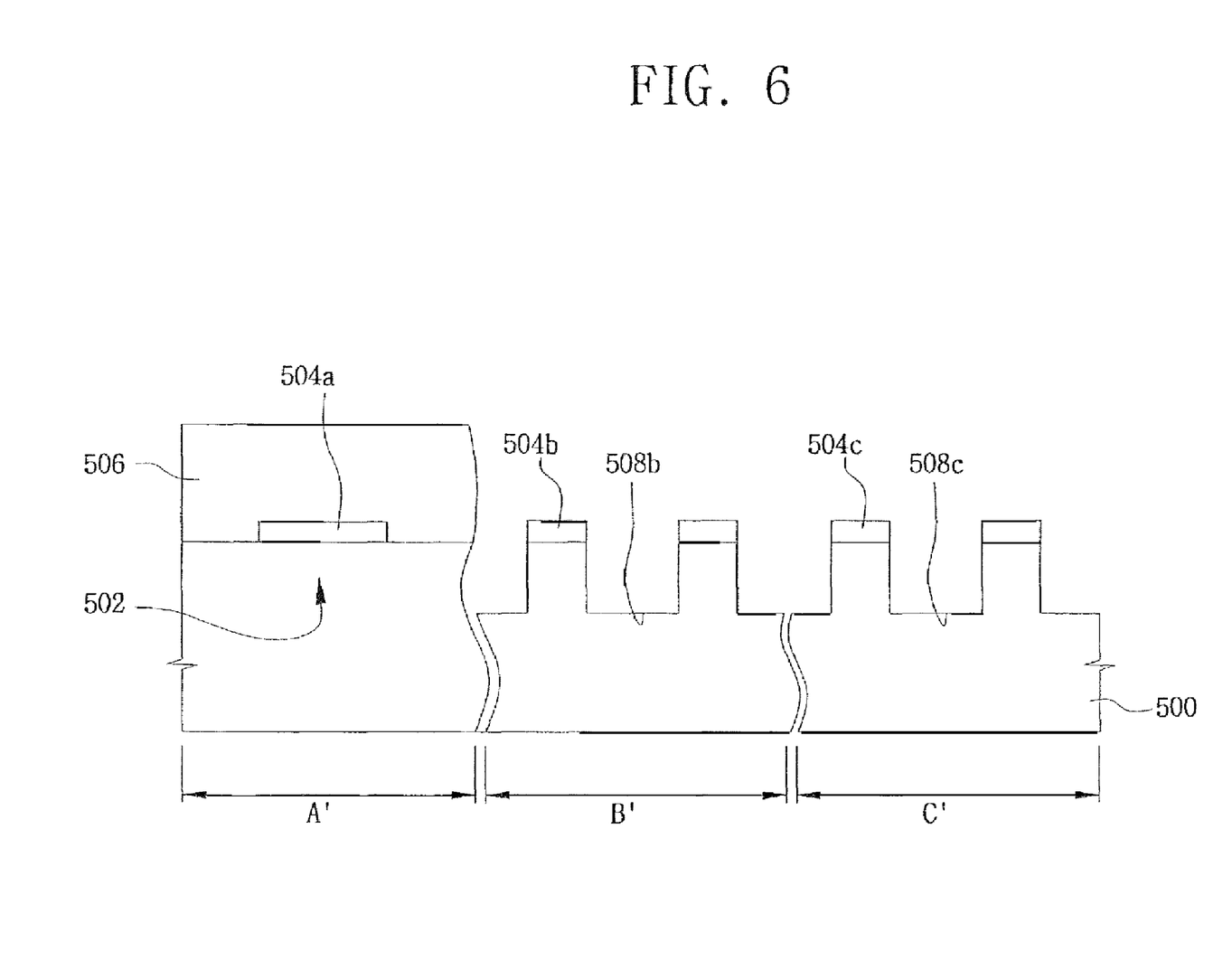

Referring to FIGS. 3 and 6, a photoresist layer 506 is formed on the cell active area 502 having the cell charge storage layer pattern 504a. Next, the semiconductor substrate 500 is anisotropically etched using the photoresist layer 506, the align charge storage layer pattern 504b and the overlay charge storage layer pattern 504c as etch masks. Consequently, a charge storage layer align trench 508b and a charge storage layer overlay trench 508c, self-aligned respectively to the align charge storage layer pattern 504b and the overlay charge storage layer pattern 504c, are formed within the charge storage layer align key area B' and the charge storage layer overlay key area C'. The charge storage layer align trench 508b and the charge storage layer overlay trench 508c constitutes the charge storage layer align key and the charge storage layer overlay key, respectively. According to an embodiment of the invention, preferably, the charge storage layer align trench 508b and the charge storage layer overlay trench 508c are formed to have a depth of about 700 Å to about 2,000 Å from a top surface of the semiconductor substrate 500.

Figure 7:
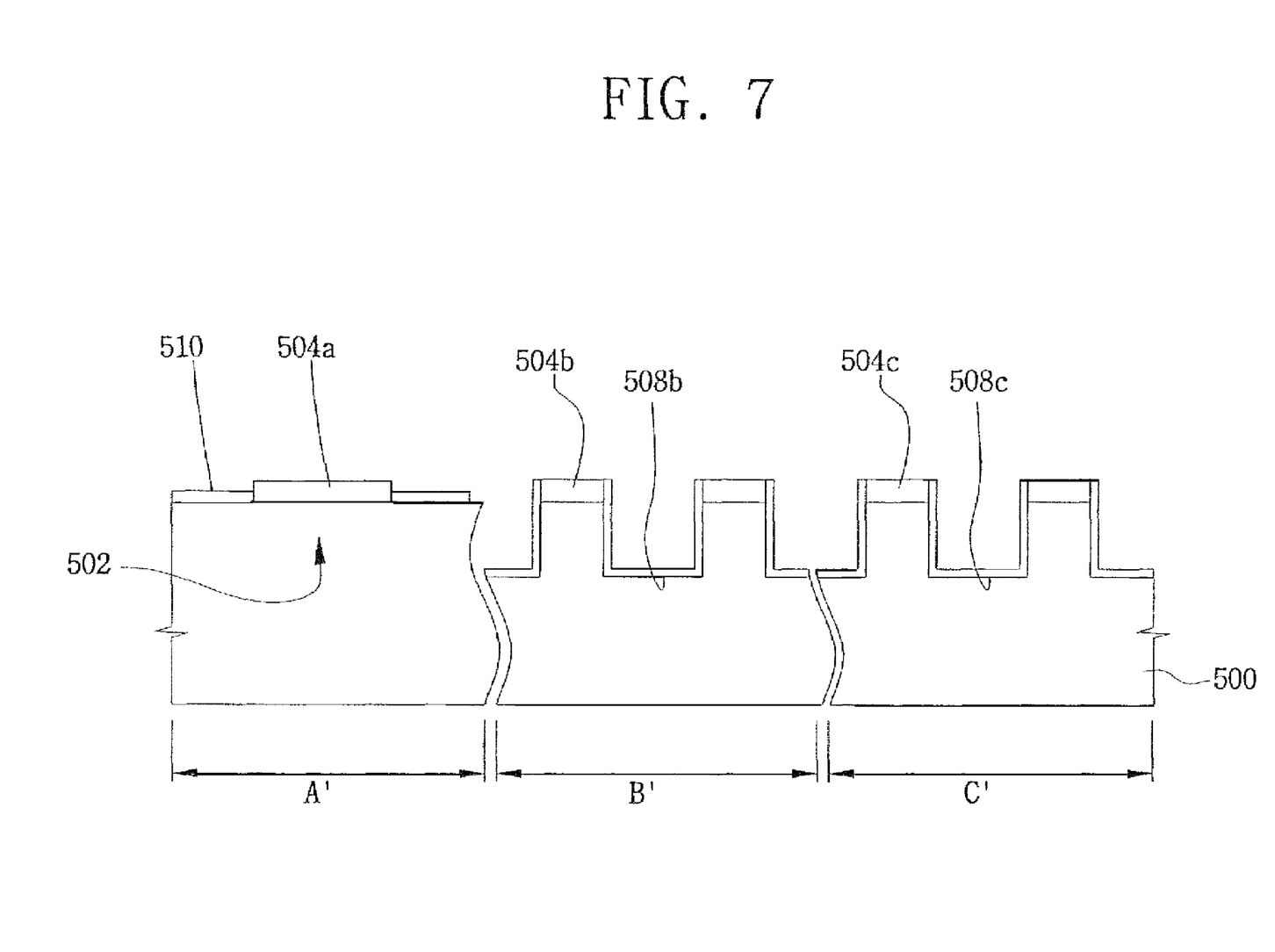

Referring to FIGS. 3 and 7, the photoresist layer 506 is removed. A gate dielectric layer 510 is then formed on the semiconductor substrate 500. The gate dielectric layer 510 may be by a chemical vapor deposition (CVD) or thermal oxidation process. Further, the gate dielectric layer 510 may be formed of SiON by a CVD process. The gate dielectric layer 510 is formed at least on the cell active area 502 adjacent the cell charge storage layer pattern 504a.

Figure 8:
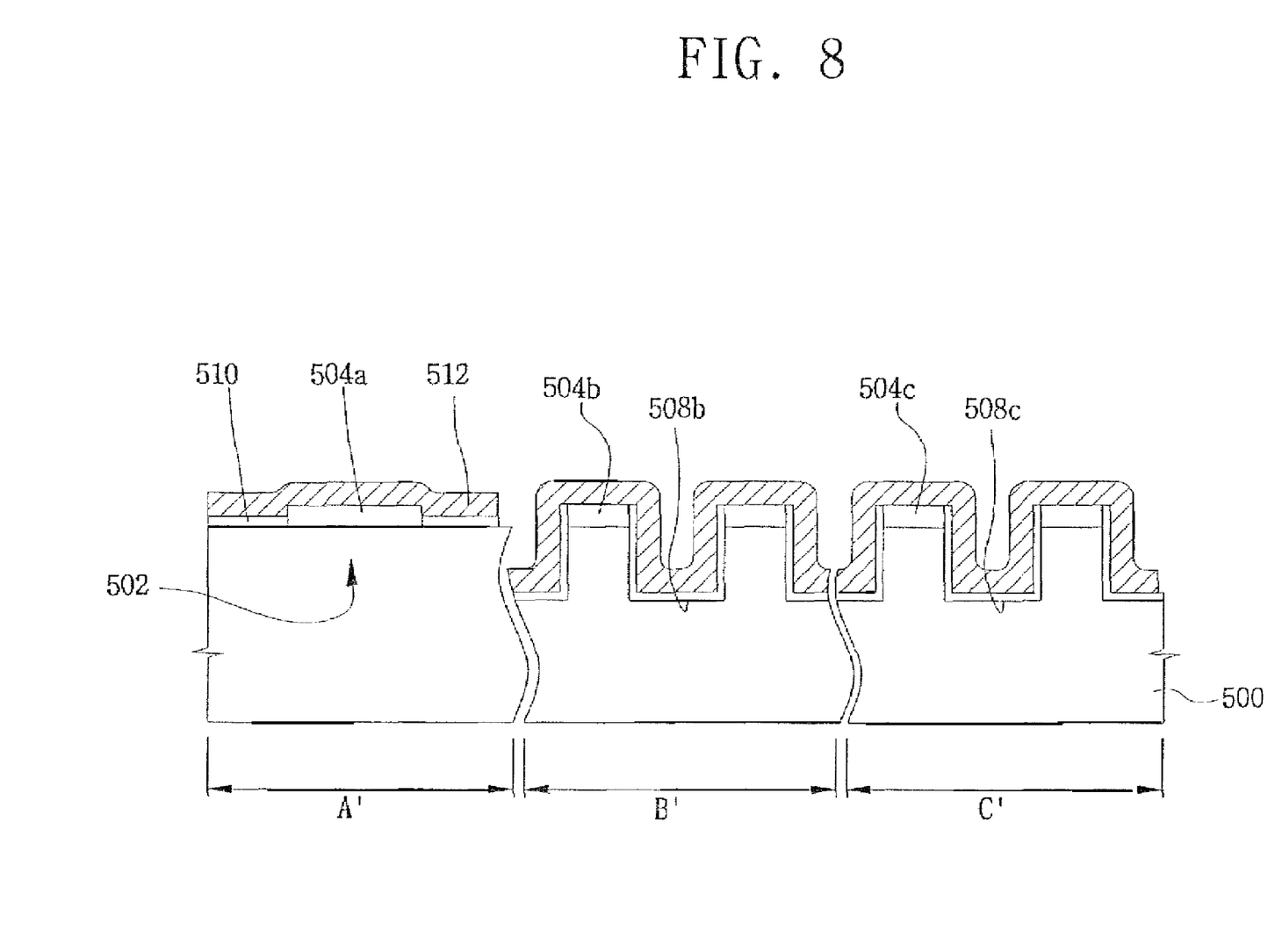

Referring to FIGS. 3 and 8, a conformal conductive layer 512 is formed on the semiconductor substrate 500 having the gate dielectric layer 510. The conductive layer 512 may be formed of a polysilicon layer, a polysilicon germanium layer or a metal layer. The metal layer may be a W layer, a Ti layer or a TiN layer. Alternatively, the conductive layer 512 may be formed of a stack layer with a combination of at least two layers chosen from the polysilicon layer, the polysilicon germanium layer or the metal layer.

Figure 9:
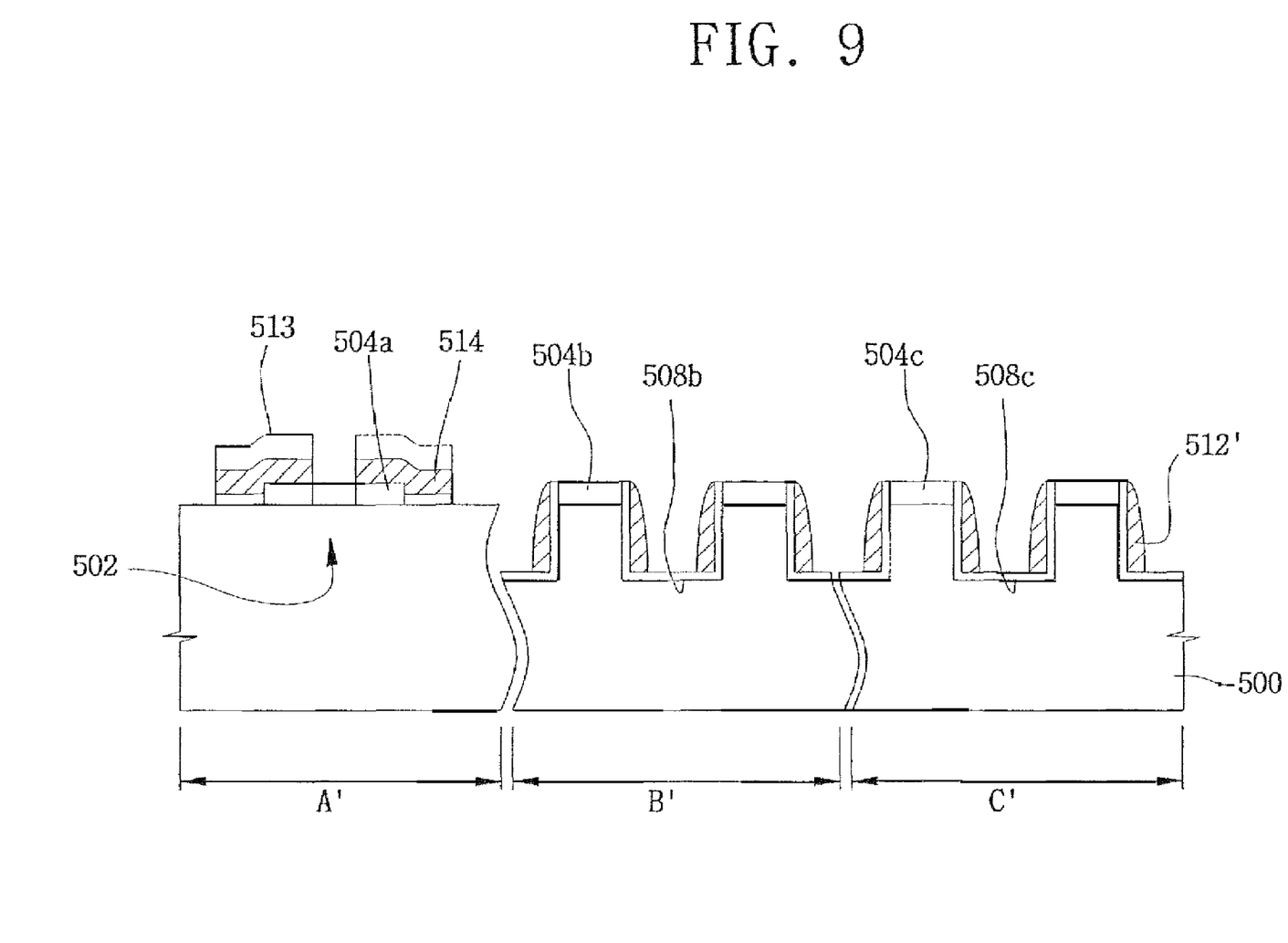

Referring to FIGS. 3 and 9, the conductive layer 512 is patterned to form gate electrodes 514 aligned with the cell charge storage layer pattern 504a. The gate electrodes 514 may be control gate electrodes of the flash memory device. More specifically, a gate photoresist layer is formed on the conductive layer 512. Next, a gate align key of a gate photomask is directly aligned with the charge storage layer align key. As described above, the charge storage layer align trench 508b constituting the charge storage layer align key is self aligned with the align charge storage layer pattern 504b, and the align charge storage layer pattern 504b can be simultaneously formed with the cell charge storage layer pattern 504a. Therefore, a gate electrode image on the photomask may be directly aligned with the cell charge storage layer pattern 504a. Next, in order to transfer the gate electrode image onto the gate photoresist layer, exposure and development processes are performed. Consequently, a gate photoresist pattern 513 is formed on the conductive layer 512. The gate photoresist pattern 513 is formed over the cell active area 502 adjacent the cell charge storage layer pattern 504a. Subsequently, an alignment correction of the semiconductor substrate 500 is performed using the overlay key that comprises the charge storage layer overlay trench 508c.

After the foregoing alignment process, the conductive layer 512 is anisotropically etched using the gate photoresist pattern 513 as an etch mask to form a gate electrode 514 directly aligned to the cell charge storage layer pattern 504a. During the anisotropic etching process, the conductive layer 512 on the charge storage layer align key area B' and charge storage layer overlay key area C' may be etched. Consequently, as shown in FIG. 9, a spacer-shaped conductive layer pattern 512' can remain on the sidewalls of the charge storage layer align trench 508b and the charge storage layer overlay trench 508c.

As described above, the align charge storage layer pattern 504b and the overlay charge storage layer pattern 504c can be simultaneously formed with the cell charge storage layer pattern 504a. Next, the charge storage layer align trench 508b and the charge storage layer overlay trench 508c constituting the charge storage layer align key and the charge storage layer overlay key respectively are formed in the semiconductor substrate 500 defined by the align charge storage layer pattern 504b and the overlay charge storage layer pattern 504c, respectively. Next, while forming the gate electrode 514, the alignment and the correction thereof are performed using the charge storage layer align key and the charge storage layer overlay key. Consequently, the gate electrode 514 can be directly aligned with the cell charge storage layer pattern 504a, thus minimizing the misalignment of the gate electrode 514. Therefore, a variation of the overlap area of the gate electrode 514 and the cell charge storage layer pattern 504a for each unit cell or main chip can be substantially reduced.

Subsequently, the cell charge storage layer pattern 504a exposed by the gate electrode 514 is etched to form a pair of separated cell charge storage layer patterns, which are interposed between the gate electrode 514 and the cell active area 502. The photoresist pattern is then removed. Alternatively, the photoresist pattern 513 may be removed prior to formation of the separated cell charge storage layer patterns. In this case, the cell charge storage layer pattern 504a is etched using the gate electrodes 514 as etch masks. Conventional ion implantation processes are performed to form source/drain region (not shown) at the cell active area 502 adjacent the gate electrodes 514.

As described above, according to an embodiment of the invention, the gate electrode of the semiconductor device can be aligned with the charge storage layer pattern, thus minimizing the misalignment between the gate electrode and the charge storage layer pattern. Consequently, the uniformity of the overlap area between the gate electrode and the charge storage layer pattern can be improved, so that the semiconductor device exhibits a stable threshold voltage distribution after program/erasure.

While the principles of this invention have been shown and described with reference to preferred embodiments, it will be understood by those skilled in the art that various changes in form and details may be made without departing from those principles. The invention should therefore be interpreted to encompass all such variations coming within the spirit and scope of the claims.

What is claimed is:

1. A method of fabricating a semiconductor device, the method comprising:
   providing a semiconductor substrate having a cell area and an align key area thereon;
   forming an isolation layer to define a cell active area within the semiconductor substrate;
   forming a charge storage layer pattern extending across the cell active area and forming an align charge storage layer pattern on the align key area; and forming an align trench within the align key area, the align trench self-aligned with the align charge storage layer pattern.

2. The method of claim 1, wherein forming the align trench comprises:
    forming a photoresist layer on the cell active area having the cell charge storage layer pattern, the photoresist layer exposing at least the align key area; and
    etching the semiconductor substrate using the photoresist layer and the align charge storage layer pattern as an etch mask.

3. The method of claim 1, wherein the align trench is formed to have a depth of about 700 Å to about 2,000 Å from a top surface of the semiconductor substrate.

4. The method of claim 1, further comprising:
    forming a gate dielectric layer at least on the cell active area adjacent the cell charge storage layer pattern;
    forming a conformal conductive layer on the semiconductor substrate;
    forming a gate photoresist layer on the conductive layer; and
    aligning a gate align key of a gate photomask with the align trench of the semiconductor substrate having the gate photoresist layer thereon.

5. The method of claim 4, further comprising:
    exposing and developing the gate photoresist layer, using the aligned gate photomask, to form a gate photoresist pattern that crosses over the cell active area adjacent the cell charge storage layer pattern; and
    etching the conductive layer, using the gate photoresist pattern, as an etch mask to form a gate electrode.

6. A method of fabricating a semiconductor device, the method comprising:
    preparing a semiconductor substrate having a cell area, an align key area and an overlay key area thereon;
    forming an isolation layer to define a cell active area within the semiconductor substrate;
    forming a cell charge storage layer pattern that extend across the cell active area and respectively forming an align charge storage layer pattern and an overlay charge storage layer pattern on the align key area and the overlay key area of the semiconductor substrate;
    forming a photoresist layer on the cell active area having the cell charge storage layer pattern; and
    etching the semiconductor substrate, using the photoresist layer, the align charge storage layer pattern and the overlay charge storage layer pattern as an etch mask, to form an align trench and an overlay trench, each being respectively self-aligned with the align charge storage layer pattern in the align key area and the overlay charge storage layer pattern in the overlay key area.

7. The method of claim 6, wherein the align trench and the overlay trench are formed to have a depth of about 700 Å to about 2,000 Å from a top surface of the semiconductor substrate.

8. The method of claim 6, further comprising:
    forming a gate dielectric layer at least on the cell active area adjacent the cell charge storage layer pattern;
    forming a conformal conductive layer on the semiconductor substrate having the gate dielectric layer thereon;
    forming a gate photoresist layer on the conductive layer;
    aligning a gate align key of a gate photomask with the align trench of the semiconductor substrate having the gate photoresist layer thereon;
    exposing and developing the gate photoresist layer using the aligned gate photomask to form a gate photoresist pattern that crosses over the cell active area adjacent the cell charge storage layer pattern; and
    etching the conductive layer using the gate photoresist pattern as an etch mask to form a gate electrode.

9. The method of claim 6, wherein forming the cell charge storage layer pattern and forming the align charge storage layer pattern and the overlay charge storage layer pattern are performed concurrently.

* * * * *